United States Patent
Huang

(10) Patent No.: US 10,694,089 B2
(45) Date of Patent: Jun. 23, 2020

(54) LED PROJECTION DEVICE FOR A CAMERA AND METHOD FOR CONTROLLING A LIGHT PATTERN PROJECTED BY THE LED PROJECTION DEVICE

(71) Applicants: Yuan-Tai Huang, Taipei (TW); Ming-Lun Ku, Taipei (TW); Sander Electronic Co., Ltd., Taipei (TW)

(72) Inventor: Yuan-Tai Huang, Taipei (TW)

(73) Assignees: Yuan-Tai Wang, Taipei (TW); Ming-Lun Ku, Taipei (TW); Sander Electric Co., Ltd., Taipei (TW)

( * ) Notice: Subject to any disclaimer, the term of this patent is extended or adjusted under 35 U.S.C. 154(b) by 46 days.

(21) Appl. No.: 16/199,488

(22) Filed: Nov. 26, 2018

(65) Prior Publication Data
US 2020/0068103 A1     Feb. 27, 2020

(30) Foreign Application Priority Data

Aug. 24, 2018   (TW) ............................. 107129698 A

(51) Int. Cl.
| | |
|---|---|
| *H04N 5/225* | (2006.01) |
| *G02B 3/00* | (2006.01) |
| *H01L 25/075* | (2006.01) |
| *H01L 33/60* | (2010.01) |
| *H01L 33/58* | (2010.01) |

(52) U.S. Cl.
CPC ............. *H04N 5/2256* (2013.01); *G02B 3/00* (2013.01); *H01L 25/0753* (2013.01); *H01L 33/58* (2013.01); *H01L 33/60* (2013.01); *H04N 5/2253* (2013.01); *H04N 5/2254* (2013.01); *G02B 2003/0093* (2013.01)

(58) Field of Classification Search
CPC .. H04N 5/2256; H04N 5/2254; H04N 5/2253; H01L 33/58; H01L 33/60; H01L 25/0753; G02B 3/00; G02B 2003/0093
See application file for complete search history.

(56) References Cited

U.S. PATENT DOCUMENTS

| | | | | |
|---|---|---|---|---|
| 6,850,631 B1* | 2/2005 | Oda | ................... | G06K 9/00604 |
| | | | | 348/78 |
| 7,812,789 B2* | 10/2010 | Park | ..................... | G09G 3/2029 |
| | | | | 345/208 |

(Continued)

*Primary Examiner* — Shahbaz Nazrul
(74) *Attorney, Agent, or Firm* — Thomas J. Nikolai; DeWitt LLP

(57) ABSTRACT

A light-emitting diode (LED) projection device for a camera has a substrate and at least one LED package mounted on the substrate. Each LED package includes a reflection surface, at least one LED chip disposed in the reflection surface, and a packaging lens encapsulating the at least one LED chip. By choosing a suitable amount of the LED chips that have suitable sizes and displacements and are encapsulated by suitable types of the packaging lenses, the light beams emitted from the LED chips can form a substantially rectangular light pattern that corresponds in shape to a field of view of the lens assembly. The brightness of the light pattern having better uniformity is formed and the dark area around the light pattern is reduced. The desired light pattern can be formed through simple manufacturing process and structure.

12 Claims, 22 Drawing Sheets

(56) References Cited

U.S. PATENT DOCUMENTS

| | | | | |
|---|---|---|---|---|
| 8,130,312 | B2* | 3/2012 | Hiltunen | H04N 5/2251 |
| | | | | 257/432 |
| 8,198,109 | B2* | 6/2012 | Lerman | H01L 25/0753 |
| | | | | 438/28 |
| 9,420,149 | B2* | 8/2016 | Liu | G01S 17/89 |
| 10,498,934 | B2* | 12/2019 | Nunnink | H04N 5/2252 |
| 2003/0019934 | A1* | 1/2003 | Hunter | G06K 7/10584 |
| | | | | 235/462.2 |
| 2005/0087601 | A1* | 4/2005 | Gerst, III | G06K 7/10732 |
| | | | | 235/455 |
| 2007/0206114 | A1* | 9/2007 | Tanaka | G03B 15/03 |
| | | | | 348/371 |
| 2008/0238338 | A1* | 10/2008 | Latham | A61B 5/0059 |
| | | | | 315/294 |
| 2010/0091118 | A1* | 4/2010 | Fujinawa | G03B 17/54 |
| | | | | 348/207.99 |
| 2011/0180818 | A1* | 7/2011 | Lerman | H01L 25/0753 |
| | | | | 257/88 |
| 2013/0264970 | A1* | 10/2013 | Kuan | H01L 33/60 |
| | | | | 315/312 |
| 2014/0111970 | A1* | 4/2014 | Lu | G09F 13/04 |
| | | | | 362/97.1 |
| 2014/0160300 | A1* | 6/2014 | Hung | H04N 5/33 |
| | | | | 348/164 |
| 2015/0292884 | A1* | 10/2015 | Fuchikami | H04N 5/232 |
| | | | | 348/135 |
| 2017/0148775 | A1* | 5/2017 | Wu | H01L 33/504 |
| 2017/0175974 | A1* | 6/2017 | Lee | G02B 19/0066 |
| 2017/0302834 | A1* | 10/2017 | Lee | H04N 5/33 |
| 2017/0343786 | A1* | 11/2017 | Cooper | G02B 17/004 |
| 2017/0370544 | A1 | 12/2017 | Wu et al. | |

* cited by examiner

LED PROJECTION DEVICE FOR A CAMERA AND METHOD FOR CONTROLLING A LIGHT PATTERN PROJECTED BY THE LED PROJECTION DEVICE

CROSS-REFERENCE TO RELATED APPLICATIONS

This application is based upon and claims priority under 35 U.S.C. 119 from Taiwan Patent Application No. 107129698 filed on Aug. 24, 2018, which is hereby specifically incorporated herein by this reference thereto.

BACKGROUND OF THE INVENTION

1. Field of the Invention

The present invention relates to a light emitting device, and more particularly to a light-emitting diode (LED) projection device for a camera and a method for controlling a light pattern projected by the LED projection device.

2. Description of the Prior Art(s)

A light-emitting diode (LED) is a light emitting device that converts electrical energy into light and has advantages of power saving, long useful life and so forth. Therefore, in recent years, the LEDs have gradually developed to become widely used for lighting purpose. The LEDs that are used for illumination can be installed on a camera, such as a still camera, a video camber, a webcam, a surveillance camera or the like, to perform as a supplementary light source.

Generally, pictures or videos taken or filmed by the camera are displayed on or via display devices, such smart phones, large TVs, projectors, movie projectors and the like, and aspect ratios of screens of the display devices have become wider and flatter. With reference to FIG. 10A to 10C, in order to adapt to viewers' angles of view, the aspect ratio of the screen of the display device has evolved from 4:3 to 16:9. Accordingly, an aspect ratio of an image that is taken or filmed by the camera has to fit the aspect ratio of the screen of the display device. However, since a light pattern 71 that is projected by the LED onto a field of view (FoV) 70, which forms the image, is circular, it is difficult to light up the whole FoV 70 uniformly.

As shown in FIG. 10A, if the circular light pattern 71 of the LED is surrounded by a perimeter of the FoV 70, a flashlight effect occurs. Brightness of the FoV 70 is uneven, and a large amount of dark area 72 is formed on the FoV 70 around the light pattern 71 even though a luminous efficacy of the LED is fully utilized. As shown in FIG. 10B, if only a part of the light pattern 71, which is above a certain illumination, is taken to light up the FoV 70, the brightness of the FoV 70 will be more uniform. However, a small amount of dark area 72' will still be formed on the FoV 70, and a small amount of wasted lighting area 73 will be formed accordingly. Therefore, an illumination efficiency of the LED is just medium. As shown in FIG. 10C, if the FoV 70 is fully covered by the circular light pattern 71, the brightness on the FoV 70 is the most uniform. However, the illumination efficiency of the LED is the worst, and the amount of wasted lighting area 73' is the largest. As described above, if a light beam from the LED is not treated in advance, the light beam from the LED will not be fully utilized.

In order to overcome the above-mentioned shortcomings, two conventional ways are used to fulfill illumination on the FoV 70 that forms the image.

With reference to FIG. 11, multiple dual in-line pin package (DIP) LEDs 80 may be used on the camera. In order to fulfill the illumination on the FoV, the DIP LEDs 80 are arranged circularly on a substrate at equiangular intervals. Two pins 81 of each DIP LED 80 are precisely cut and bent, such that light beam from each DIP LED 80 is projected in a specific projection angle. However, precisely cutting and bending the pins 81 of each DIP LEDs 80 require precise and complicated processing process. Consequently, qualities of the DIP LEDs 80 are unstable. It is hard to control the projection angles of the light beams from the DIP LEDs 80.

With further reference to FIG. 12, multiple surface-mount device (SMD) LED modules 90 may be used on the camera. Each SMD LED module 90 includes a printed circuit board (PCB) 91 and at least one LED chip mounted on the PCB 91. Light beam 92 from each LED chip of each SMD LED module 90 is projected in a direction perpendicular to the PCB 91. Therefore, in order to fulfill the illumination on the FoV, the PCBs 91 of the SMD LED modules 90 have to be tilted toward different directions, such that the light beams 92 of the SMD LED modules 90 are projected onto different positions of the FoV. Accordingly, the SMD LED modules 90 are able to light up the FoV uniformly. However, designs for configuration of the SMD LED modules 90 are difficult, and the tilted SMD LED modules 90 occupy rooms and require circuits and connectors for electrical connections. Therefore, using the SMD LED modules 90 on the camera also require complicated processing process. Qualities of the SMD LED modules 90 are unstable. It is also hard to control projection angles of the light beams from the SMD LED modules 90.

In addition, a conventional primary optics light source with rectangular light pattern, as disclosed in US patent publication with publication No. US 2017/0370544 A1, has a substrate, a LED chip, and an encapsulated package. The LED chip is installed on the substrate. The encapsulated package covers the LED chip to fix the LED chip onto the substrate. A pair of first bent sections, a pair of second bent sections, and a top section are sequentially arranged from the substrate and on a cross-section of the encapsulated package along an x-axis. The first bent sections are disposed opposite to each other and are extended from the substrate to couple with the second bent sections respectively. The second bent sections are also disposed opposite to each other and are coupled with two opposite ends of the top section respectively. The first bent sections, the second bent sections, and the top section are all arc shaped. A cross-section of the encapsulated package along a y-axis is arc shaped. The x-axis and the y-axis are perpendicular to each other. A plane included between the x-axis and the y-axis is parallel to a plane of the substrate provided for installing the LED chip. A light emitted from the LED chip passes through the encapsulated package to form a rectangular light pattern. Thus, when a light source is lit, a specific rectangular illumination light pattern can be formed. However, since the encapsulated package is designed with the x-axis and the y-axis being asymmetry, a mold for forming the encapsulated package is complicated and costs high.

To overcome the shortcomings, the present invention provides a LED projection device for a camera and a method for controlling a light pattern projected by the LED projection device to mitigate or obviate the aforementioned problems.

SUMMARY OF THE INVENTION

The main objective of the present invention is to provide a light-emitting diode (LED) projection device for a camera and a method for controlling a light pattern that is projected by the LED projection device.

In order to achieve the aforementioned objective, the LED projection device for the camera comprises a substrate and at least one LED package. The at least one LED package is mounted on the substrate. Each of the at least one LED package includes a reflection surface, at least one LED chip, and a packaging lens. The at least one LED chip is disposed in the reflection surface. The packaging lens encapsulates the at least one LED chip and is attached to the reflection surface. The camera has a lens assembly including a circuit board. The circuit board is parallel with the substrate. The at least one light beam that is emitted from the at least one LED chip of the LED package and passes through the packaging lens is refracted by the packaging lens and forms a non-circular light pattern.

In order to achieve the aforementioned objective, the method for controlling the light pattern projected by the LED projection comprises steps of:

step 1: determining a relation between a size of the LED chip and a first viewing angle ratio;

wherein the first viewing angle ratio is designated as "Var1", and the size of the LED chip 21 is defined as a width of the LED chip 21 and is designated as "Cs", and the first viewing angle ratio is determined by (a) confirming a type of the packaging lens of the LED package;
(b) choosing three different sizes of the LED chips (Cs);
(c) encapsulating the three LED chips with the packaging lenses having the same curvature;
(d) determining the first viewing angle ratio (Var1) by a formula as follows:

$$Var1=f(Cs);$$

step 2: determining a relation between a displacement of the LED chip and a second viewing angle ratio;

wherein the second viewing ratio is designated as "Var2", and the displacement of the LED chip is define as a distance between the LED chip and a center position and is designated as "Ds", and the second viewing angle ratio is determined by (a) choosing the type of the packaging lens as used in step 1;
(b) choosing three LED packages, wherein the size of the LED chips of the three LED packages are the same and the displacements of the three LED chips (Ds) are different;
(c) encapsulating the three LED chips with the packaging lenses having the same curvature; and
(d) defining the second viewing angle ratio (Var2) of the LED chip with displacement of 0 mm as 100%; and
(e) determining the second viewing angle ratio (Var2) by a formula as follows:

$$Var2=f(Ds);$$

step 3: determining a relation between a height of the packaging lens and a third viewing angle ratio;

wherein the height of the packaging lens is defined as a distance between the LED chip and a top end of the packaging lens and is designated as "H", and the third viewing angle ratio of the LED package is designated as "Var3", and the third viewing angle ratio is determined by (a) choosing the type of the packaging lens as used in step 1;
(b) choosing three LED packages, wherein the size of the LED chips of the LED packages are the same and the heights of the packaging lenses of the LED packages are different;
(c) encapsulating the three LED chips with the packaging lenses having the same curvature;
(d) defining the displacements of the three LED chips (Ds) as 0 mm; and
(e) determining the third viewing angle ratio by a formula as follows:

$$Var3=f(H); \text{ and}$$

step 4: determining a viewing angle (Va) of the LED package by a formula as follows:

$$Va=f(H) \times f(Cs) \times f(Ds).$$

In order to achieve the aforementioned objective, the method for controlling the light pattern projected by the LED projection comprises steps of:

step A: calculating a radius of curvature of the packaging lens according to the height of the packaging lens and a radius of a circle surrounded by the packaging lens and defined on a reflection surface for mounting the LED chip;

wherein the radius of curvature of the packaging lens is designated as "R", the radius of the circle surrounded by the packaging lens and defined on the reflection surface for mounting the LED chip is designated as "a", and the radius of curvature of the packaging lens is calculated by a formula as follows:

$$R=(H^2+a^2)/(2H); \text{ and}$$

step B: calculating an angle of incidence θ1 of the light beam emitted from the LED chip on the packaging lens when the LED chip is disposed away from the center position, wherein the angle of incidence is calculated by a formula as follows:

$$\theta 1 = \arcsin(Ds/R); \text{ and}$$

step C: calculating the off-center angle θ2 of the light beam emitted out of the packaging lens by a formula as follows:

$$\theta 2 = \arcsin(1.5 \times \sin \theta 1).$$

Different displacements of the LED chips and different types of the packaging lenses of the LED packages form the light beams having different viewing angles and different off-center angles. Therefore, by choosing a suitable amount of the LED chips that have suitable sizes and displacements and are encapsulated by suitable types of the packaging lenses and mounting the LED packages on the substrate, the light beams emitted from the LED chips can form a substantially rectangular light pattern that corresponds in shape to the field of view of the lens assembly.

The brightness of the light pattern having better uniformity is formed and the dark area around the light pattern is reduced. The desired light pattern can be formed through simple manufacturing process and structure.

Other objectives, advantages and novel features of the invention will become more apparent from the following detailed description when taken in conjunction with the accompanying drawings.

BRIEF DESCRIPTION OF THE DRAWINGS

FIG. 3-2A is a schematic top view of the first implementation of the LED package in FIG. 3-1A;

FIG. 3-3A is a schematic view of a light pattern of the first implementation of the LED package in FIG. 3-1A;

FIG. 3-1B is a schematic side view of a second implementation of a LED package of the LED projection device in FIG. 1;

FIG. 3-2B is a schematic top view of the second implementation of the LED package in FIG. 3-1B;

FIG. 3-3B is a schematic view of a light pattern of the second implementation of the LED package in FIG. 3-1B;

FIG. 3-1C is a schematic side view of a third implementation of a LED package of the LED projection device in FIG. 1;

FIG. 3-2C is a schematic top view of the third implementation of the LED package in FIG. 3-1C;

FIG. 3-3C is a schematic view of a light pattern of the third implementation of the LED package in FIG. 3-1B;

FIG. 4-1A is an operational schematic view of a first implementation of a LED projection device in accordance with the present invention, wherein the LED projection device is shown having two LED package;

FIG. 4-2A is an operational schematic view of a camera having the first implementation of the LED projection device in FIG. 4-1A;

FIG. 4-1B is an operational schematic view of a second implementation of a LED projection device in accordance with the present invention, wherein the LED projection device is shown having four LED package;

FIG. 4-2B is an operational schematic view of a camera having the second implementation of the LED projection device in FIG. 4-1B;

FIG. 4-1C is an operational schematic view of a third implementation of a LED projection device in accordance with the present invention, wherein the LED projection device is shown having six LED package;

FIG. 4-2C is an operational schematic view of a camera having the third implementation of the LED projection device in FIG. 4-1C;

DETAILED DESCRIPTION OF THE PREFERRED EMBODIMENTS

Figure 1:
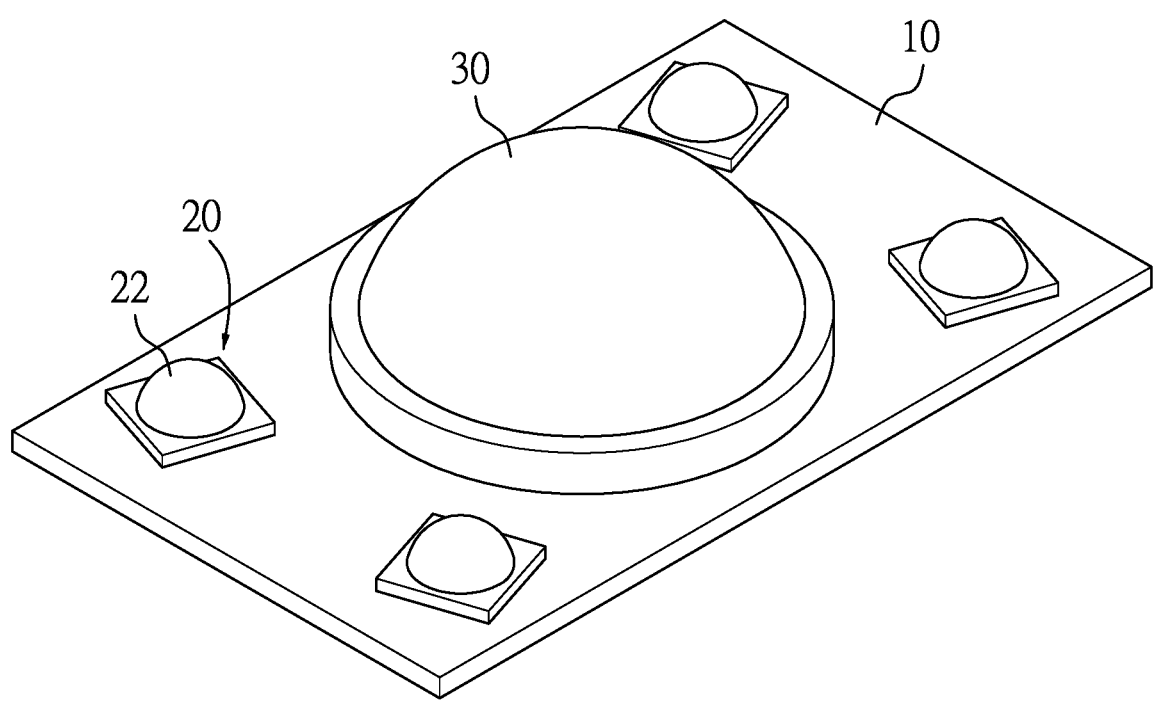
FIG. 1 a perspective view of a light-emitting diode (LED) projection device for a camera in accordance with the present invention.

With reference to FIG. 1, a light-emitting diode (LED) projection device for a camera in accordance with the present invention comprises a substrate 10 and at least one LED package 20.

In the preferred embodiment, the substrate 10 is a printed circuit board (PCB).

Figure 2:
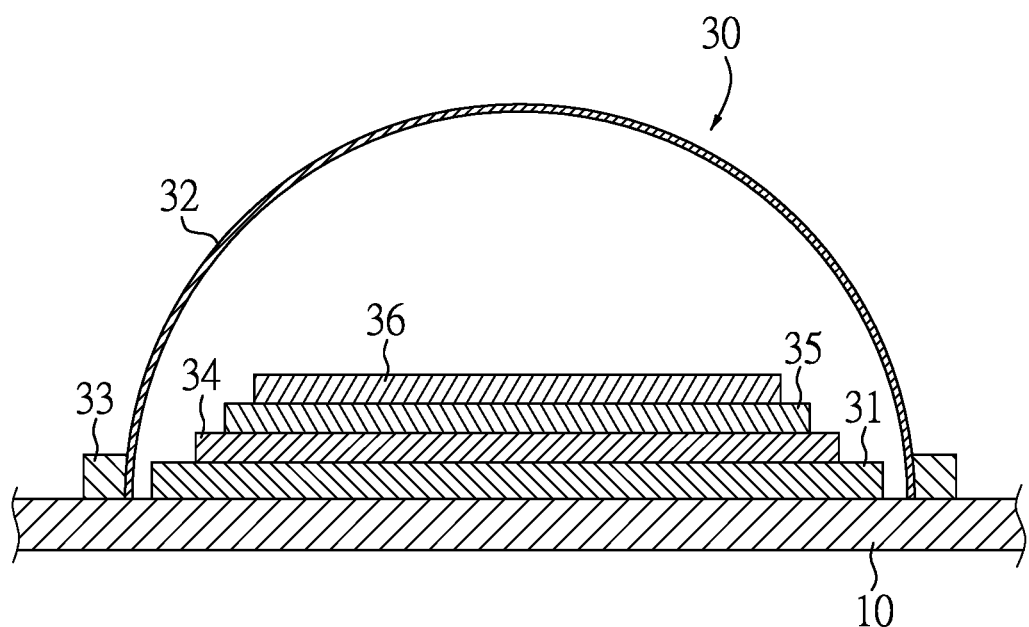
FIG. 2 is an enlarged cross-sectional side view of a lens assembly of the camera in FIG. 1.

With further reference to FIG. 2, a lens assembly 30 of the camera is mounted on the substrate 10 and includes a circuit board 31. The circuit board 31 is mounted on and is parallel with the substrate 10. In the preferred embodiment, the lens assembly 30 is mounted on and through the substrate 10, so as to form a part of the camera. Specifically, the lens assembly 30 further includes a lens 32, a fastener 33, a digital signal processing chip 34, an image sensor 35, and a filter 36. The digital signal processing chip 34, the image sensor 35, and the filter 36 are stacked on the circuit board 31 in sequence. The lens 32 is hollow and hemisphere, is mounted on the circuit board 31, and covers the digital signal processing chip 34, the image sensor 35 and the filter 36. The fastener 33 securely connects the lens 32 and the substrate 10. In the preferred embodiment, the lens assembly 30 is used for taking images such as pictures or videos. The lens assembly 30 receives the images through the lens 32 and the filter 36. The image sensor 35 transmits digital signals to the digital signal processing chip 34 to allow the digital signal processing chip 34 to show the images on a screen. The lens assembly 30 is conventional.

Figures 1A, 3:
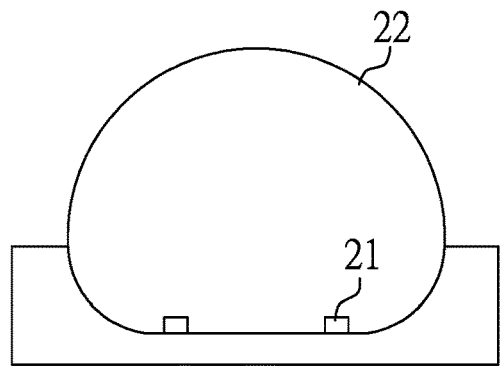
FIG. 3-1A is a schematic side view of a first implementation of a LED package of the LED projection device in FIG. 1.
Figures 2A, 3:
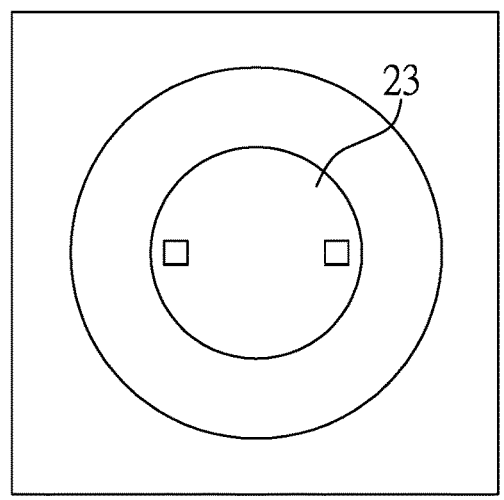
Figures 3, 3A:
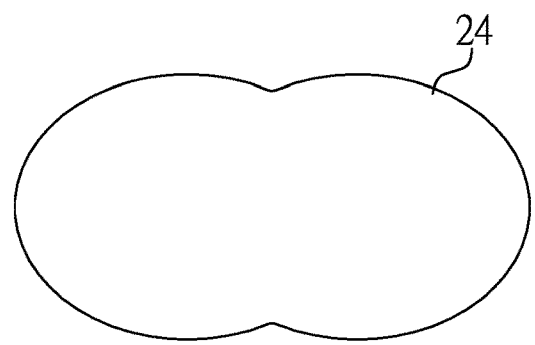
Figures 1B, 3:
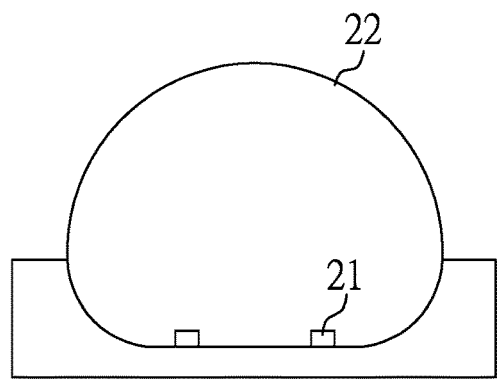
Figures 2B, 3:
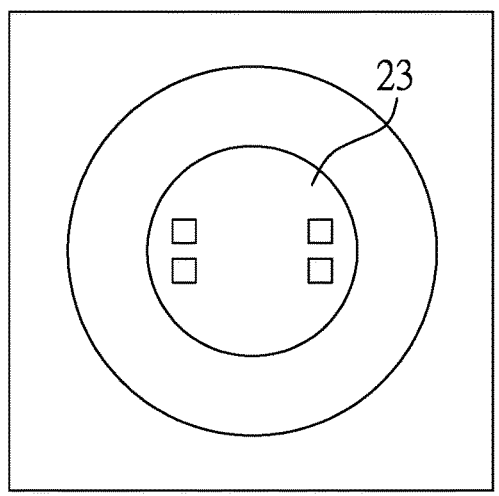
Figures 3, 3B:
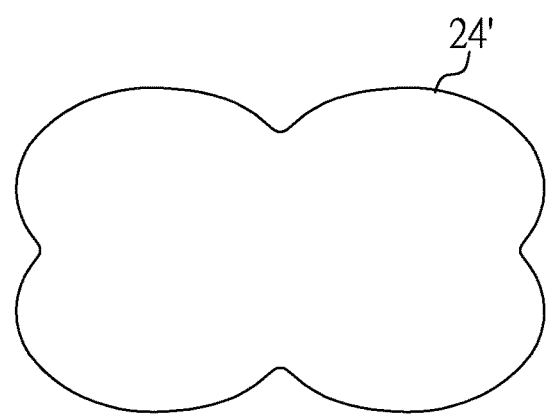

With reference to FIGS. 1 and 3A to 3B, the at least one LED package 20 is mounted on the substrate 10. Each of the at least one LED package 20 includes a reflection surface 23, at least one LED chip 21, and a packaging lens 22.

The reflection surface 23 is defined in a lead frame 50. The at least one LED chip 21 is disposed in the reflection surface 23 and may be an ordinary LED chip that emit visible light or an infrared (IR) LED chip that emit invisible infrared rays.

The packaging lens 22 encapsulates the at least one LED chip 21 and is attached to the reflection surface 23. In the preferred embodiment, the packaging lens 22 is symmetrical in shape and encapsulates the at least one LED chip 21 via sealant. The packaging lens 22 refracts at least one light beam that is emitted from the at least one LED chip 21 and passing through the packaging lens 22 one or more than one times, so as to control a projection angle of the at least one light beam.

In the preferred embodiment, the at least one light beam from the at least one LED chip 21 of the LED package 20 passes through and is refracted by the packaging lens 22 to form a non-circular light pattern. The non-circular light pattern corresponds in shape to a field of view (FoV) which forms the image that the lens assembly 30 is about to be taken. In the present invention, the non-circular light pattern is substantially rectangular.

Preferably, the at least one LED chip 21 of the LED package 20 is disposed away from a center of the reflection surface 23. When each of the at least one LED package 20 includes even number of LED chips 21, each two of the LED chips 21 are placed at opposite sides of the center of the reflection surface 23 and are equidistant from the center of the reflection surface 23.

Specifically, with reference to FIG. 3A, when each of the at least one LED package 20 includes two LED chips 21, a shape of the light pattern 24 is substantially elliptic. With reference to 3B, when each of the at least one LED package 20 includes four LED chips 21, a shape of the light pattern 24' is between elliptic and rectangular. Four corners of the light pattern 24' are substantially right angles. With reference to 3C, when each of the at least one LED package 20 includes six LED chips 21, a shape of the light pattern 24" is substantially rectangular. Four corners of the light pattern 24" are further close to right angles. A number of the LED chips 21 of each LED package 20 are not limited as described above. Each of the at least one LED package 20 may include more than six LED chips 21 as long as the LED chips 21 are symmetrically placed beside the center of the reflection surface 23.

Figures 1C, 3:
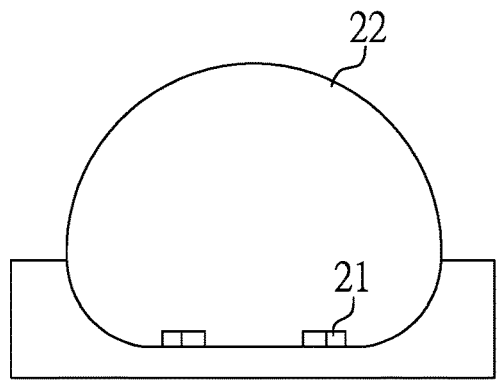
Figures 2C, 3:
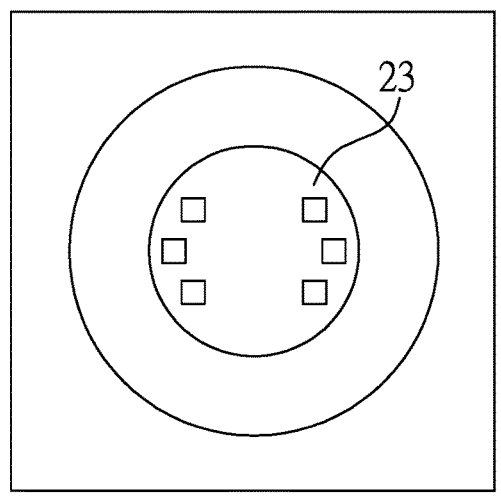
Figures 3, 3C:
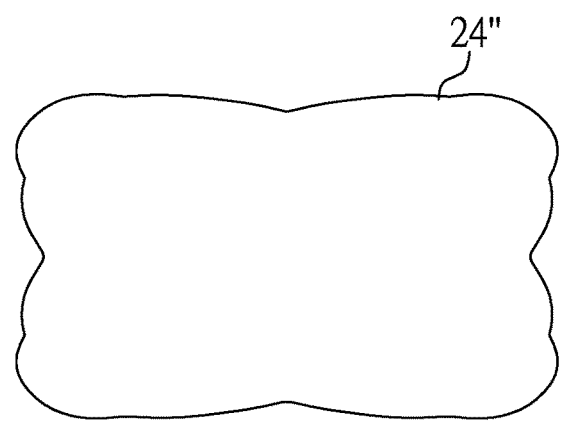
Figures 1A, 4:
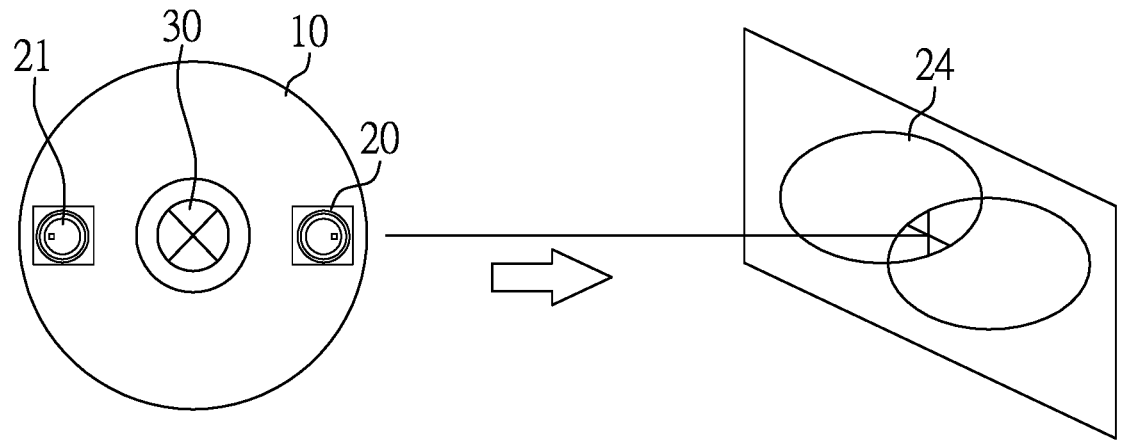
Figures 2A, 4:
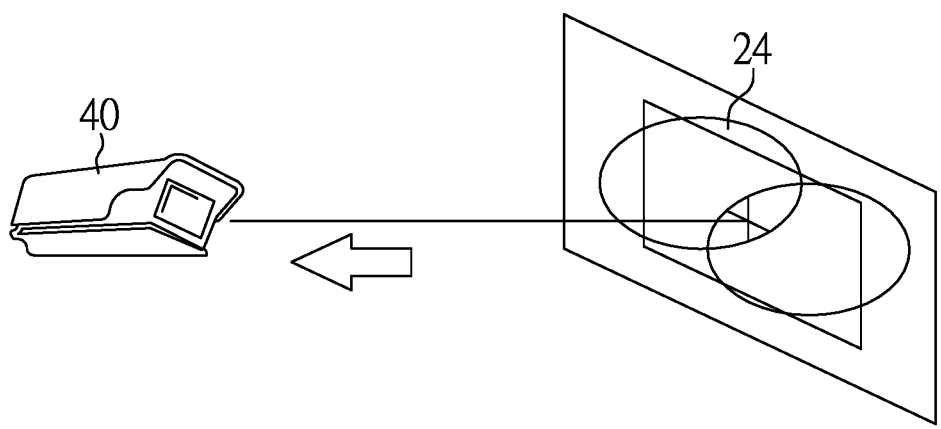
Figures 1B, 4:
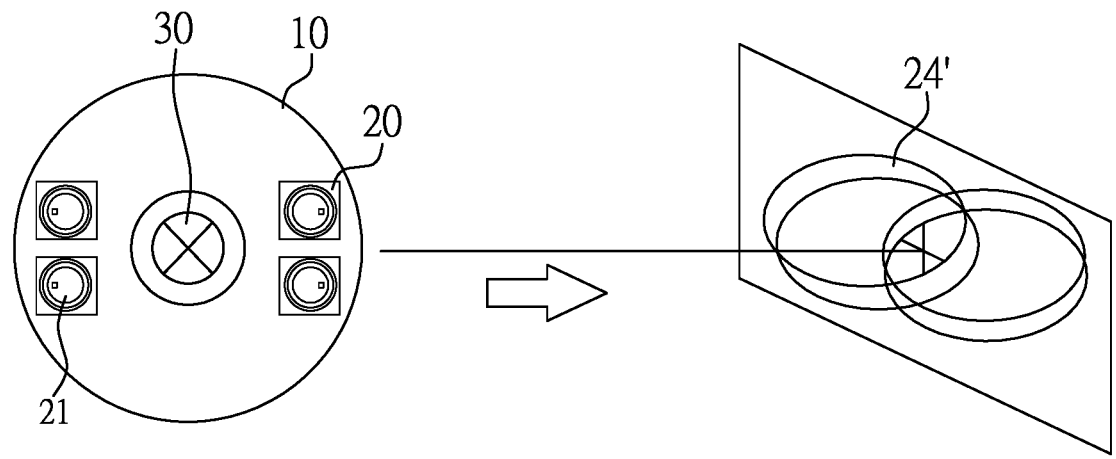
Figures 2B, 4:
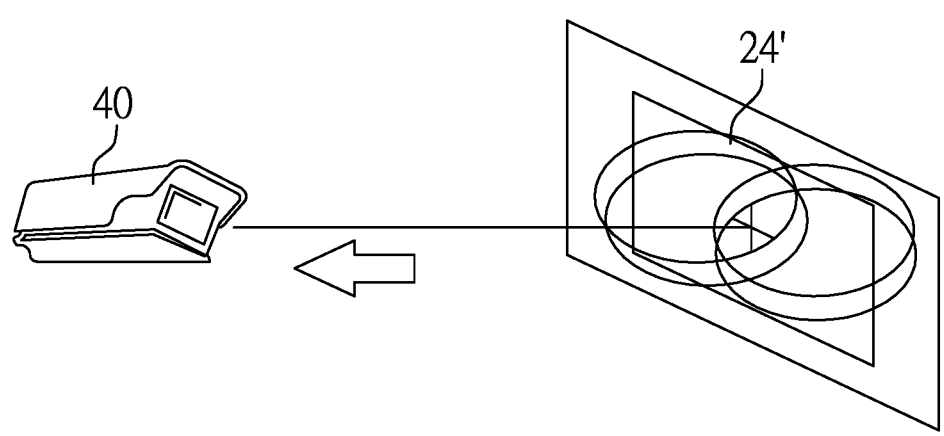
Figures 1C, 4:
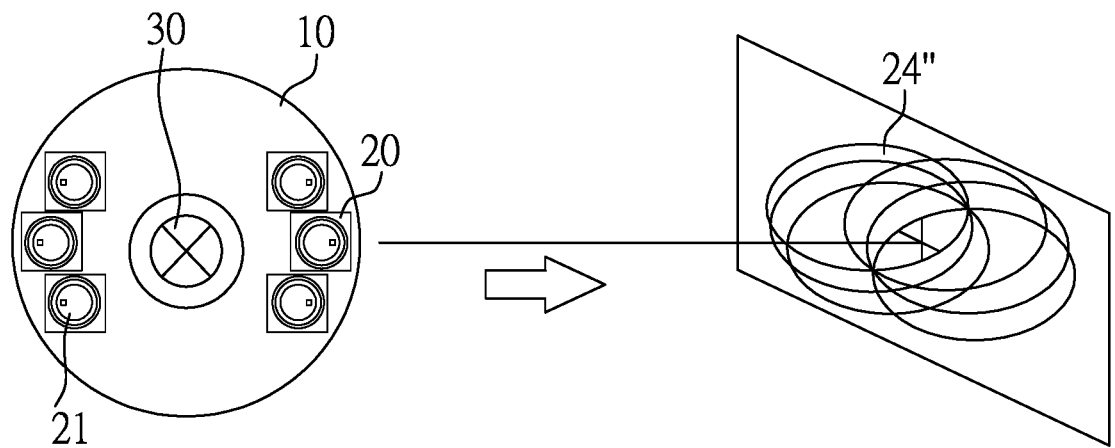
Figures 2C, 4:
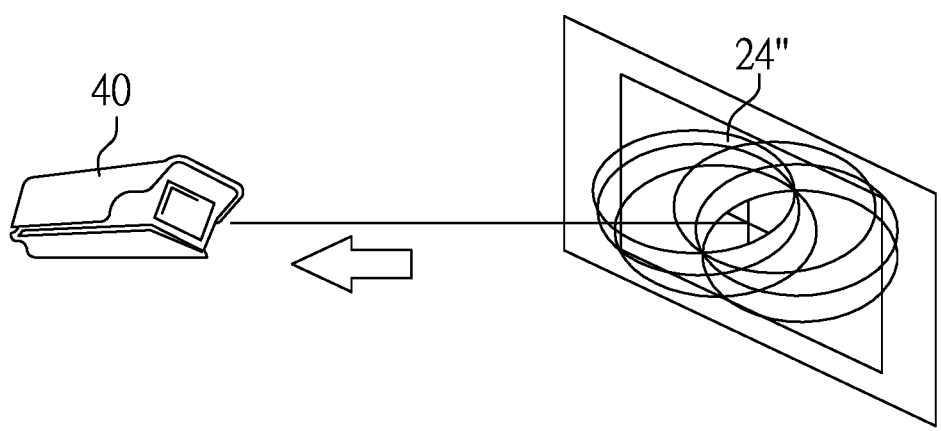

With further reference to FIGS. 4-1A to 4-2C, another preferred embodiment of the present invention is shown. When each of the at least one LED package 20 includes only one LED chip 21, the at least one LED package 20 includes even number of LED packages 20. Each two the LED packages 20 are placed at opposite sides of the lens assembly 30, and the LED chip 21 of each LED package 20 is disposed away from the center of the reflection surface 23.

When the LED projection device is used on a camera 40, as shown in FIGS. 4-1A and 4-2A, two LED packages 20 are mounted on the substrate 10 and are equidistant from the lens assembly 30. The lens assembly 30 is performed as a center point between the two LED packages 20. The light beams emitted from the LED chips 21 of the LED packages 20 are projected onto a plane that the lens assembly 30 is about to be taken, and form a light pattern 24 on the plane. The image sensor 35 of the lens assembly 30 on the camera 40 takes an image with an aspect ratio of 4:3, 16:10, or 16:9 from the plane that is lighted up by the light pattern 24. As shown in FIGS. 4-1B and 4-2B, four LED packages 20 are mounted on the substrate 10 and are equidistant from the lens assembly 30. The lens assembly 30 is performed as a center point between the four LED packages 20. The light beams emitted from the LED chips 21 of the LED packages 20 are projected onto the plane that the lens assembly 30 is about to be taken, and form a light pattern 24' on the plane. The image sensor 35 of the lens assembly 30 on the camera 40 takes an image with the aspect ratio of 4:3, 16:10, or 16:9 from the plane that is lighted up by the light pattern 24'. As shown in FIGS. 4-1C and 4-2C, six LED packages 20 are mounted on the substrate 10 and are equidistant from the lens assembly 30. The lens assembly 30 is performed as a center point between the six LED packages 20. The light beams emitted from the LED chips 21 of the LED packages 20 are projected onto the plane that the lens assembly 30 is about to be taken, and form a light pattern 24" on the plane. The image sensor 35 of the lens assembly 30 on the camera 40 takes an image with the aspect ratio of 4:3, 16:10, or 16:9 from the plane that is lighted up by the light pattern 24". As described above, by increasing the number of the LED packages 20 and changing distribution of the LED packages 20, uniformity of brightness of the light pattern 24, 24', 24" can be increased.

With further reference to FIGS. 7A to 7D, the following description describes mounting one LED chip 21 in the reflection surface 23 of the LED package 20, so as to form the light pattern 24A, 24A', 24B, 24B' by using different numbers of the LED packages 20 and the light beams having different off-center angles and forming different viewing angles.

Figure 7A:
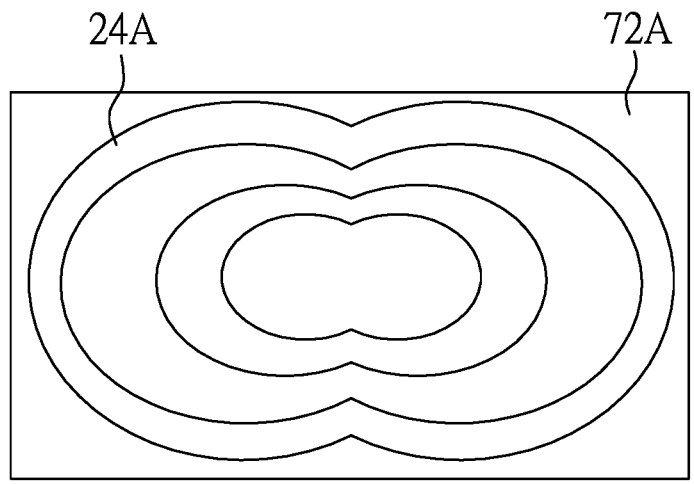
FIG. 7A is a schematic view of an embodiment of a light pattern formed by a LED package having two LED chips.
Figure 7B:
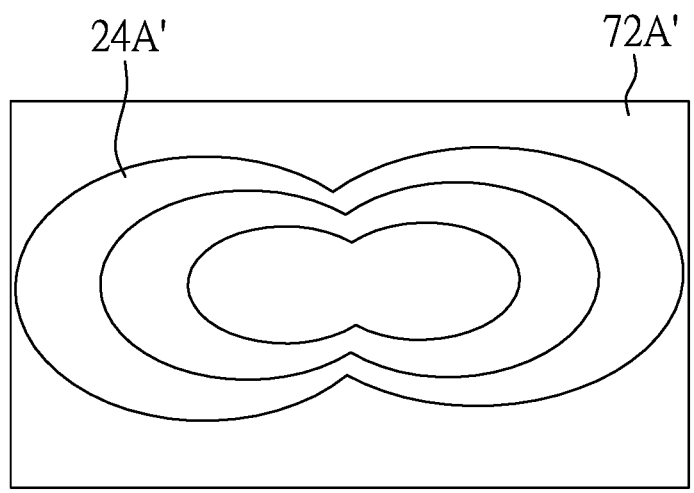
FIG. 7B is a schematic view of another embodiment of a light pattern formed by a LED package having two LED chips.

As shown in FIGS. 7A and 7B, when projecting the rectangular light pattern 24A, 24A' with two LED packages 20, the light pattern 24A that is formed by emitting the light beams that form smaller viewing angles and have larger off-center angles (as shown in FIG. 7A) is larger and more close to a rectangle than the light pattern 24A' that is formed by emitting the light beams that form larger viewing angles and have smaller off-center angles (as shown in FIG. 7B). Accordingly, dark area 72A around the light pattern 24A shown in FIG. 7A is less than dark area 72A' around the light pattern 24A' shown in FIG. 7B.

Figure 7C:
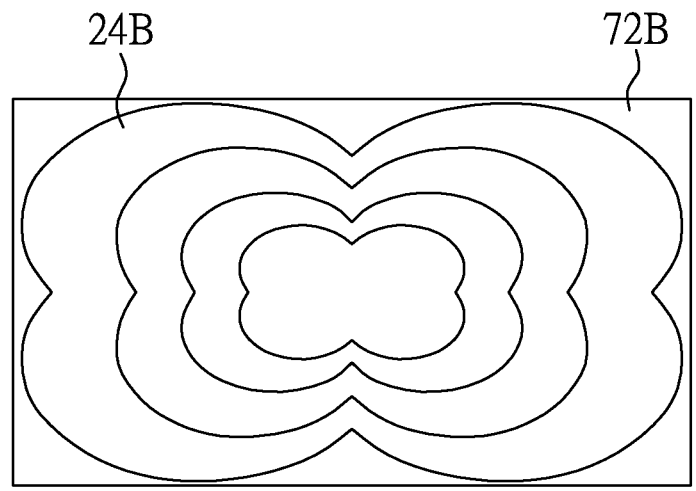
FIG. 7C is a schematic view of an embodiment of a light pattern formed by a LED package having four LED chips.
Figure 7D:
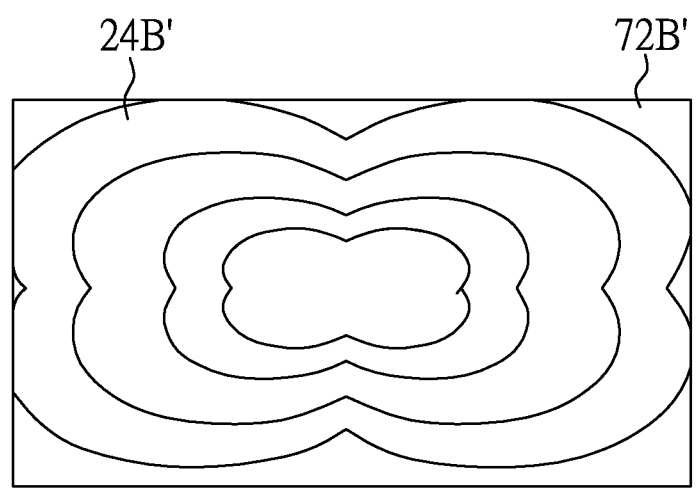
FIG. 7D is a schematic view of another embodiment of a light pattern formed by a LED package having four LED chips.

As shown in FIGS. 7C and 7D, when projecting the rectangular light pattern 24B, 24B' with four LED packages 20, the light pattern 24B that is formed by emitting the light beams that form larger viewing angles and have smaller off-center angles (as shown in FIG. 7D) is larger and more close to a rectangle than the light pattern 24B' that is formed by emitting the light beams that form smaller viewing angles and have larger off-center angles (as shown in FIG. 7C). Accordingly, dark area 72B' around the light pattern 24B' shown in FIG. 7D is less than dark area 72B around the light pattern 24B shown in FIG. 7C.

Moreover, the light patterns 24B, 24B' formed by four LED packages 20 are more close to the rectangles than the light patterns 24A, 24A' formed by two LED packages 20. Therefore, a user can form the desired light pattern 24A, 24A', 24B, 24B' by adjusting the off-center angles and the viewing angles of the light beams, and the number of the LED packages 20.

A method for controlling the light pattern projected by the LED projection device in accordance with the present invention comprises the following steps.

Step 1: determining a relation between a size of the LED chip 21 and a first viewing angle ratio.

The first viewing angle ratio is designated as "Var1". The size of the LED chip 21 is defined as a width of the LED chip 21 and is designated as "Cs". The viewing angle of the LED package 20 is defined as a half power angle of the light beam emitted from the LED package 20.

Since the size of the LED chip 21 (Cs) influences the viewing angle of the LED package 20, the first viewing angle ratio (Var1) can be determined by:

(a) confirming a type of the packaging lens 22 of the LED package 20;

(b) choosing three different sizes of the LED chips 21 (Cs); and (c) encapsulating the three LED chips 21 with the packaging lenses 22 having the same curvature.

According to the sizes of the LED chips 21 (Cs) and the first viewing angle ratio (Var1) of each of the LED chips 21, the first viewing angle ratio (Var1) is determined by a quadratic equation with one variable as follows:

$$Var1=f(Cs).$$

For instance, when the type of the packaging lens 22 of the LED package 20 is 3838 mm-mm, the sizes of the LED chips 21 are 10 mil, 20 mil and 40 mil respectively, and the first viewing angle ratio (Var1) of the LED chip 21 with size of 10 mil is 100%, the first viewing angle ratio is expressed by a formula as follows:

$$Var1=-0.0007 \times Cs^2+0.06 \times Cs+0.4667.$$

Step 2: determining a relation between a displacement of the LED chip 21 and a second viewing angle ratio.

The second viewing ratio is designated as "Var2". The displacement of the LED chip 21 is define as a distance between the LED chip 21 and a center position, and is designated as "Ds".

Since the displacement of the LED chip 21 (Ds) influences the viewing angle of the LED package 20, the second viewing angle ratio (Var2) can be determined by:

(a) choosing the type of the packaging lens 22 as used in step 1;

(b) choosing three LED packages 20, wherein the size of the LED chips 21 of the three LED packages 20 are the same and the displacements of the three LED chips 21 (Ds) are different;

(c) encapsulating the three LED chips 21 with the packaging lenses 22 having the same curvature; and (d) defining the second viewing angle ratio (Var2) of the LED chip 21 with displacement of 0 mm as 100%.

According to the displacements of the LED chips 21 (Ds) and the second viewing angle ratio (Var2) of each of the LED chips 21, the second viewing angle ratio (Var2) is determined by a quadratic equation with one variable as follows:

$$Var1=f(Cs).$$

For instance, when the type of the packaging lens 22 of the LED package 20 is 3838 mm-mm, and the displacement of the LED chips 21 are 0 mm, 0.4 mm and 0.8 mm respectively, the second viewing angle ratio (Var2) is expressed by a formula as follows:

$$Var2=0.3125 \times Ds2-0.875 \times Ds+1.$$

Step 3: determining a relation between a height of the packaging lens 22 and a third viewing angle ratio.

The height of the packaging lens 22 is defined as a distance between the LED chip 21 and a top end of the packaging lens 22, and is designated as "H". The third viewing angle ratio of the LED package 20 is designated as "Var3".

Since the height of the packaging lens 22 (H) influences the viewing angle (Var3) of the LED package 20, the third viewing angle ratio (Var3) can be determined by:

(a) choosing the type of the packaging lens 22 as used in step 1;

(b) choosing three LED packages 20, wherein the size of the LED chips 21 of the LED packages 20 are the same and the heights of the packaging lenses 22 of the LED packages 20 are different;

(c) encapsulating the three LED chips 21 with the packaging lenses 22 having the same curvature; and (d) defining the displacements of the three LED chips 21 (Ds) as 0 mm.

According to the heights of the packaging lenses 22 (H) and the third viewing angle ratio (Var3) of each of the LED packages 20, the third viewing angle ratio (Var3) is determined by a quadratic equation with one variable as follows:

$$Var3=f(H).$$

For instance, when the type of the packaging lens 22 of the LED package 20 is 3838 mm-mm, the size of the LED chips 21 (Cs) is 10 mil, and the height of the packaging lenses 22 (H) are 1.3 mm, 1.9 mm and 2.8 mm respectively, the third viewing angle ratio (Var3) is expressed by a formula as follows:

$$Var3=-44.444 \times H^2+108.89 \times H+83.556.$$

Step 4: according to the relations determined in Step 1 to Step 3, the viewing angle (Va) of the LED package 20 is expressed by a formula as follows:

$$Va=f(H) \times f(Cs) \times f(Ds).$$

Figure 9A:
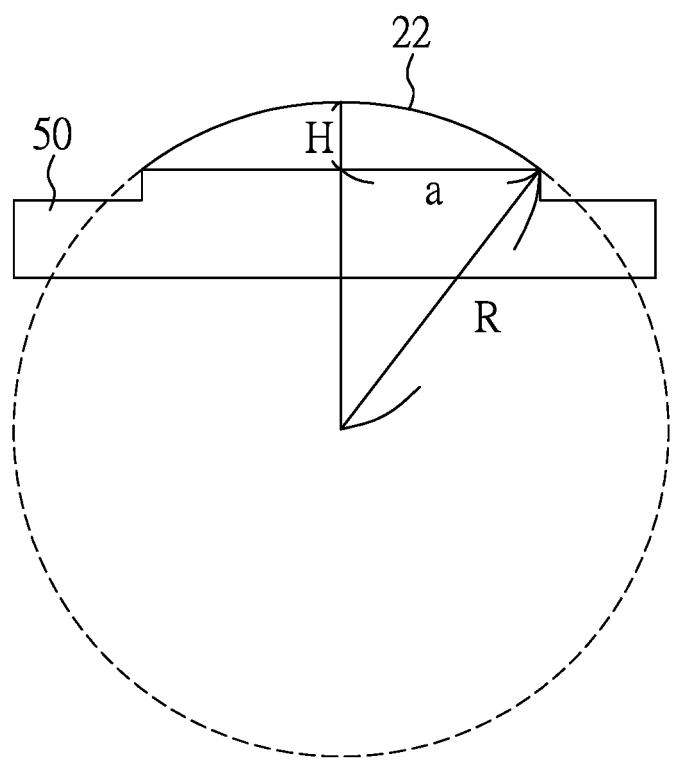
FIG. 9A is an auxiliary schematic view for calculating an off-center angle of a light beam projected by an LED package.
Figure 9B:
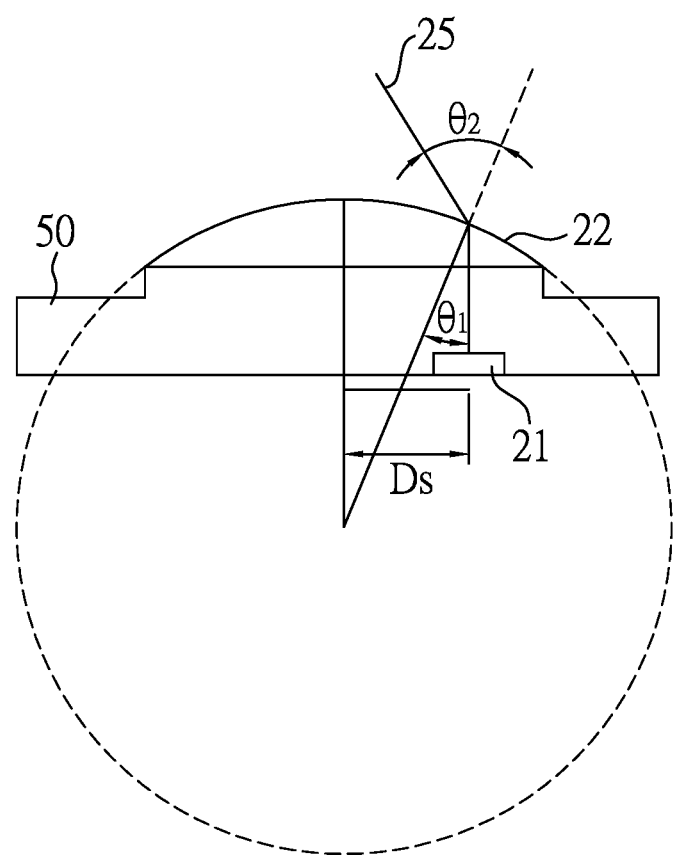
FIG. 9B is another auxiliary schematic view for calculating the off-center angle of the light beam projected by the LED package in FIG. 9A.
Figure 10A:
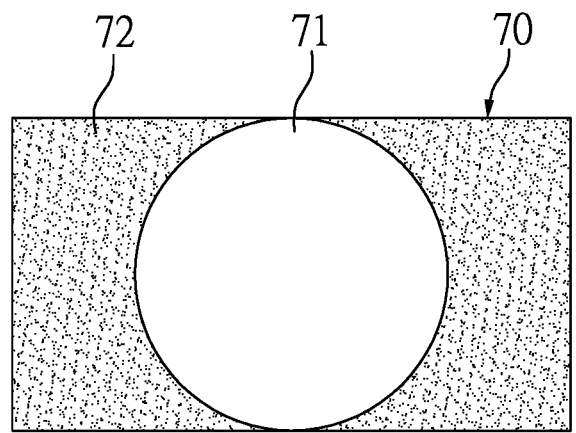
FIG. 10A is a schematic view of a first implementation of projecting a circular light pattern on an image in accordance with the prior art.
Figure 10B:
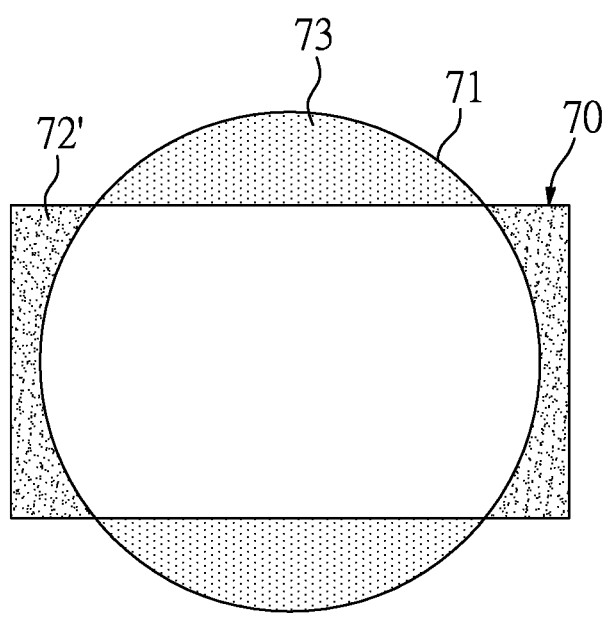
FIG. 10B is a schematic view of a second implementation of projecting a circular light pattern on an image in accordance with the prior art.
Figure 10C:
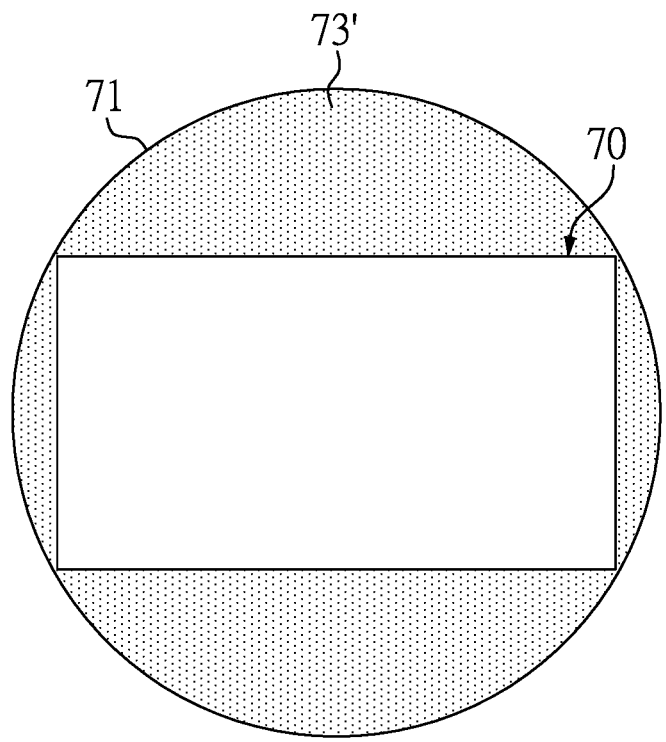
FIG. 10C is a schematic view of a third implementation of projecting a circular light pattern on an image in accordance with the prior art.
Figure 11:
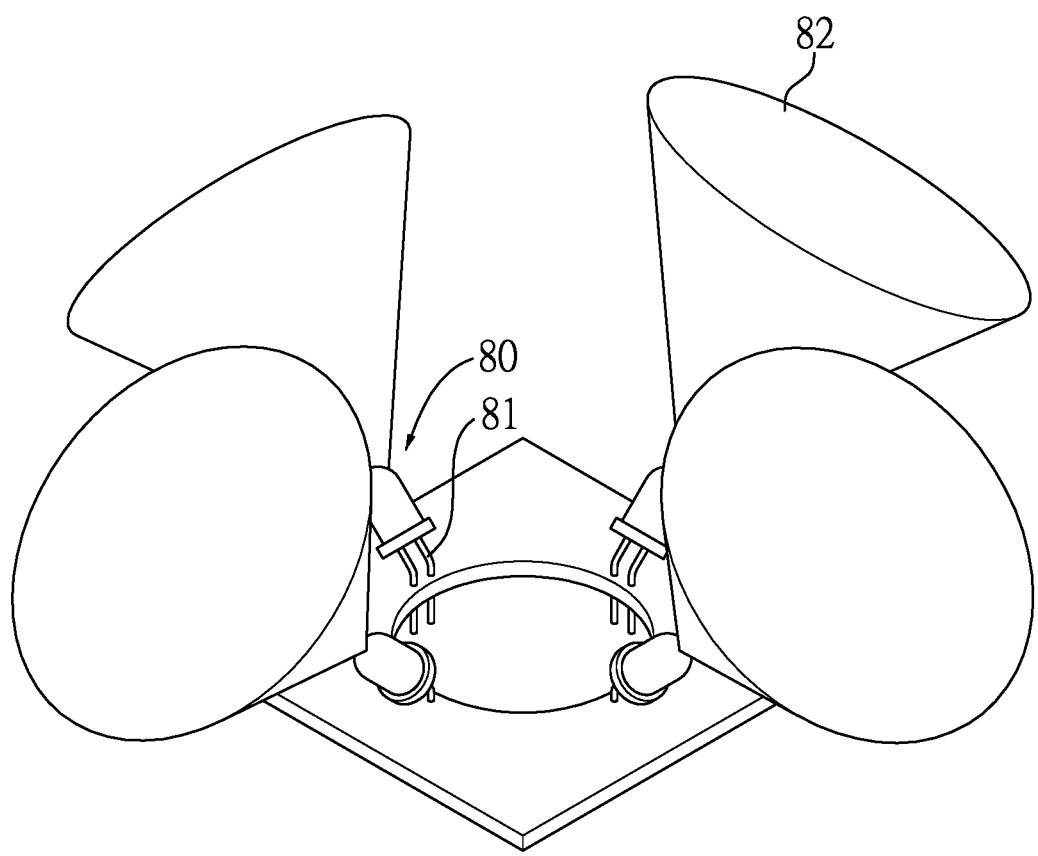
FIG. 11 is a schematic perspective view of a conventional LED projection device in accordance with the prior art.
Figure 12:
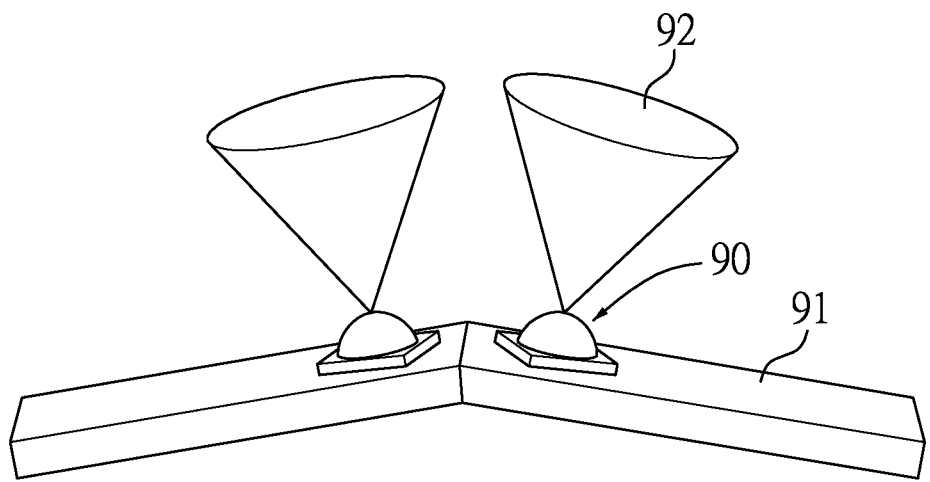
FIG. 12 is a schematic perspective view of another conventional LED projection device in accordance with the prior art.

With further reference to FIGS. 9A and 9B, in order to adjust the light beam emitted from the LED chip 21 to allow the light beam to exhibit an almost perfect Lambertian reflectance, it is necessary to calculate an off-center angle of the light beam according to ratio of luminous intensity of the LED chips 21 in all directions. A method for controlling the light pattern projected by the LED projection device in accordance with the present invention comprises the following steps.

Step A: as shown in FIG. 9A, calculating a radius of curvature of the packaging lens 22 according to the height of the packaging lens 22 (H) and a radius of a circle surrounded by the packaging lens 22 and defined on the reflection surface 23 of the lead frame 50 for mounting the LED chip 21.

The radius of curvature of the packaging lens 22 is designated as "R". The radius of the circle surrounded by the packaging lens 22 and defined on the reflection surface 23 of the lead frame 50 for mounting the LED chip 21 is designated as "a". The radius of curvature of the packaging lens 22 is calculated by a formula as follows:

$$R=(H^2+a^2)/(2H).$$

Step B: as shown in FIG. 9B, calculating an angle of incidence θ1 of the light beam emitted from the LED chip 21 on the packaging lens 22 when the LED chip 21 is disposed away from the center position, wherein the angle of incidence is calculated by a formula as follows:

$$\theta 1=\arc \sin(Ds/R).$$

Step C: calculating the off-center angle θ2 of the light beam emitted out of the packaging lens 22.

According to Snell's Law: n1×sin θ1=n2×sin θ2, with n1 as a refractive index of the packaging lens 22 and n2 as a refractive index of air around the packaging lens 22. Therefore, the off-center angle θ2 can be calculated by a formula as follows:

$$\theta 2=\arc \sin((n1/n2) \times \sin \theta 1).$$

With reference to FIGS. 8A to 8I, the calculated off-center angles can be divided into three categories.

Figure 8A:
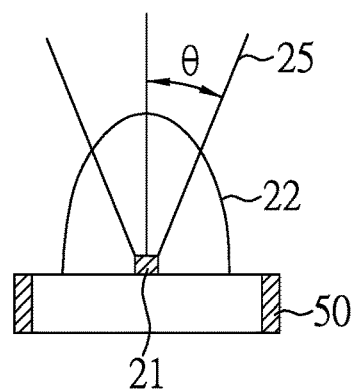
FIGS. 8A to 8C are operational schematic views of LED packages, wherein viewing angles of light beams projected by the LED packages are 60 degrees.
Figure 8B:
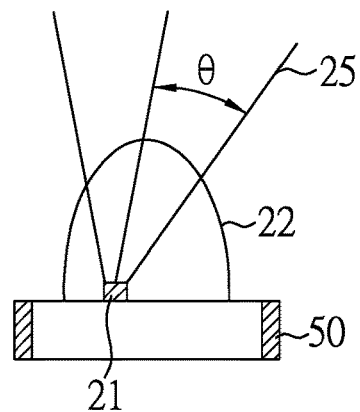
Figure 8C:
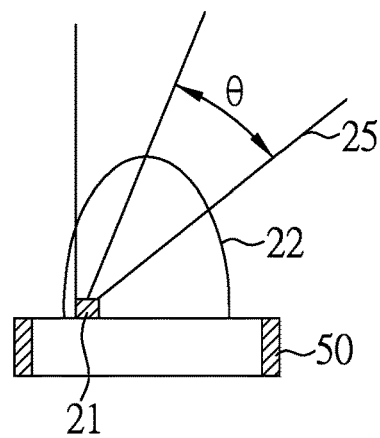
Figure 8D:
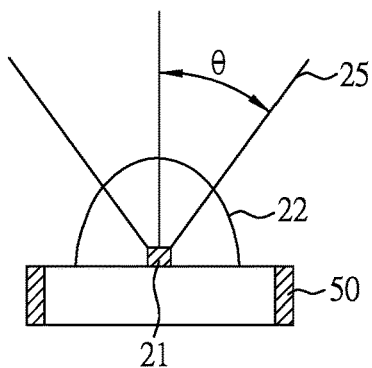
FIGS. 8D to 8F are operational schematic views of LED packages, wherein viewing angles of light beams projected by the LED packages are 90 degrees.
Figure 8E:
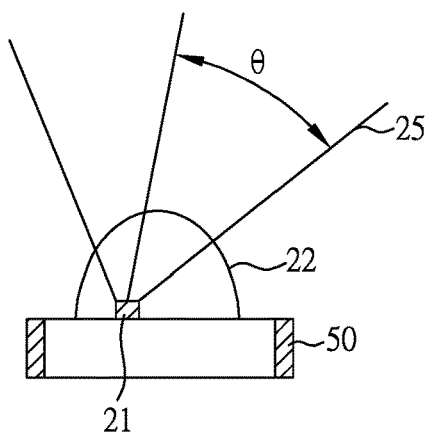
Figure 8F:
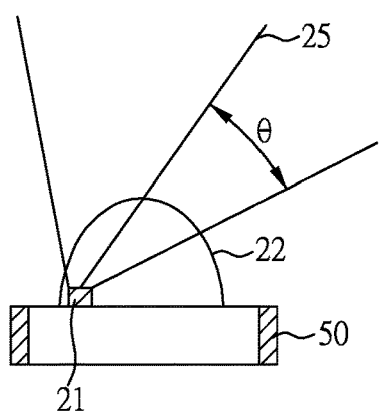
Figure 8G:
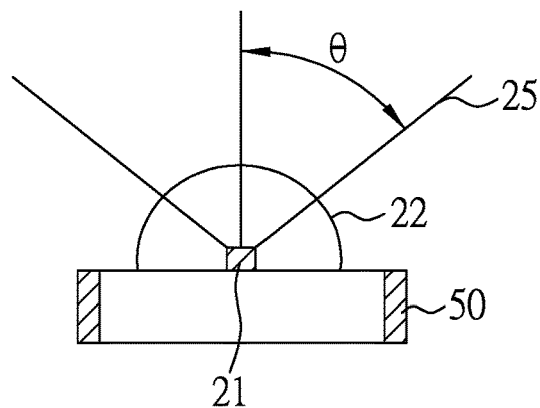
FIGS. 8G to 8I are operational schematic views of LED packages, wherein viewing angles of light beams projected by the LED packages are 120 degrees.
Figure 8H:
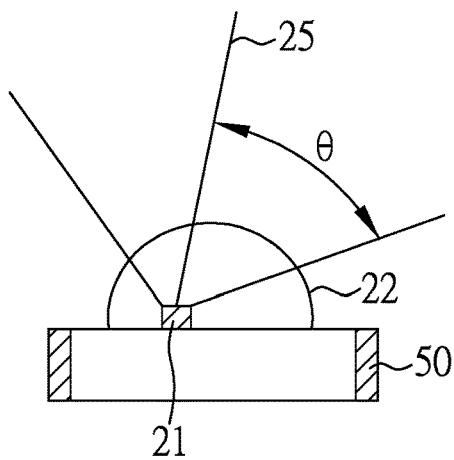
Figure 8I:
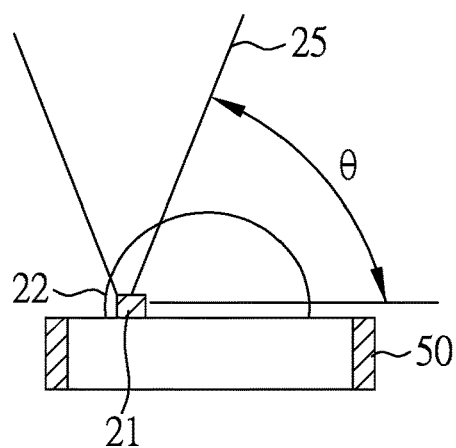

As shown in FIGS. 8A to 8C, when the viewing angle, i.e. the half power angle, of the light beam 25 emitted from the LED package 20 is equal to 60 degrees, the larger the off-center viewing angle and the larger the displacement of the LED chip 21 (Ds), the more inclined the light beam 25 emitted from the LED package 20.

Similarly, as shown in FIGS. 8D to 8F and FIGS. 8G to 8I, when the viewing angle, i.e. the half power angle, of the light beam 25 emitted from the LED package 20 is equal to 90 degrees and 120 degrees, the larger the off-center viewing angle and the larger the displacement of the LED chip 21 (Ds), the more inclined the light beam 25 emitted from the LED package 20.

Different displacements of the LED chips 21 and different types of the packaging lenses 22 of the LED packages 20 form the light beams having different viewing angles and different off-center angles. As shown in FIGS. 8A to 8I, by choosing a suitable amount of the LED chips 21 that have suitable sizes and displacements and are encapsulated by suitable types of the packaging lenses 22 and mounting the LED packages 20 on the substrate 10, the light beams emitted from the LED chips 21 can form the substantially rectangular light pattern that corresponds in shape to the field of view of the lens assembly 30. In the LED projection device of the present invention, a single LED package 20 with multiple LED chips 21 may be used, or multiple LED packages 20 with a single LED chip 21 in each LED package 20 may also be used. Thus, the brightness of the light pattern 24A, 24A', 24B, 24B' having better uniformity is formed, and the dark area 72A, 72A', 72B, 72B' around the light pattern 24A, 24A', 24B, 24B' is reduced.

In the present invention, the packaging lenses 22 are symmetrical in shape and in appearance. Therefore, the packaging lenses 22 can be formed by using conventional molds, and the light pattern 24A, 24A', 24B, 24B' can be changed in a low cost way.

Figure 5:
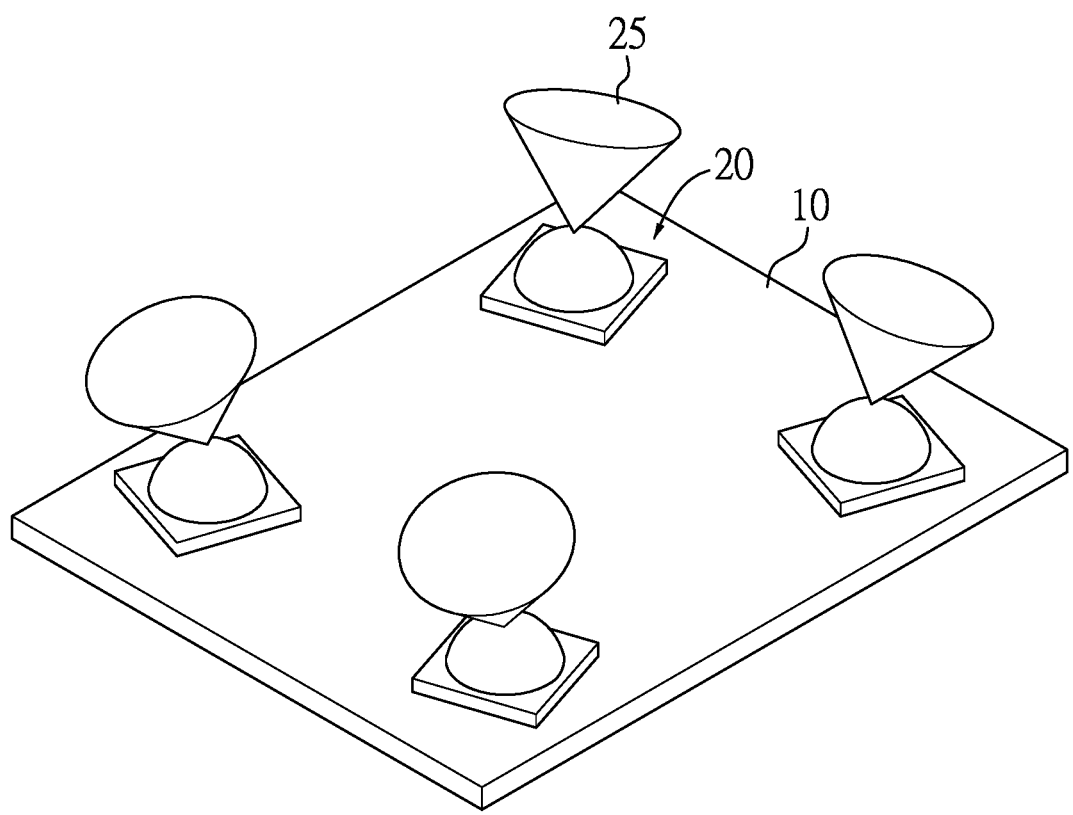
FIG. 5 is an operational schematic perspective view of the LED projection device in FIG. 1.

In the present invention, with reference to FIG. 5, the LED packages 20 on one substrate 10 can projected the light beams in specific angles, so as to form a desired light pattern 24A, 24A', 24B, 24B'. The desired light pattern 24A, 24A', 24B, 24B' can be formed through simple manufacturing process and structure.

Figure 6:
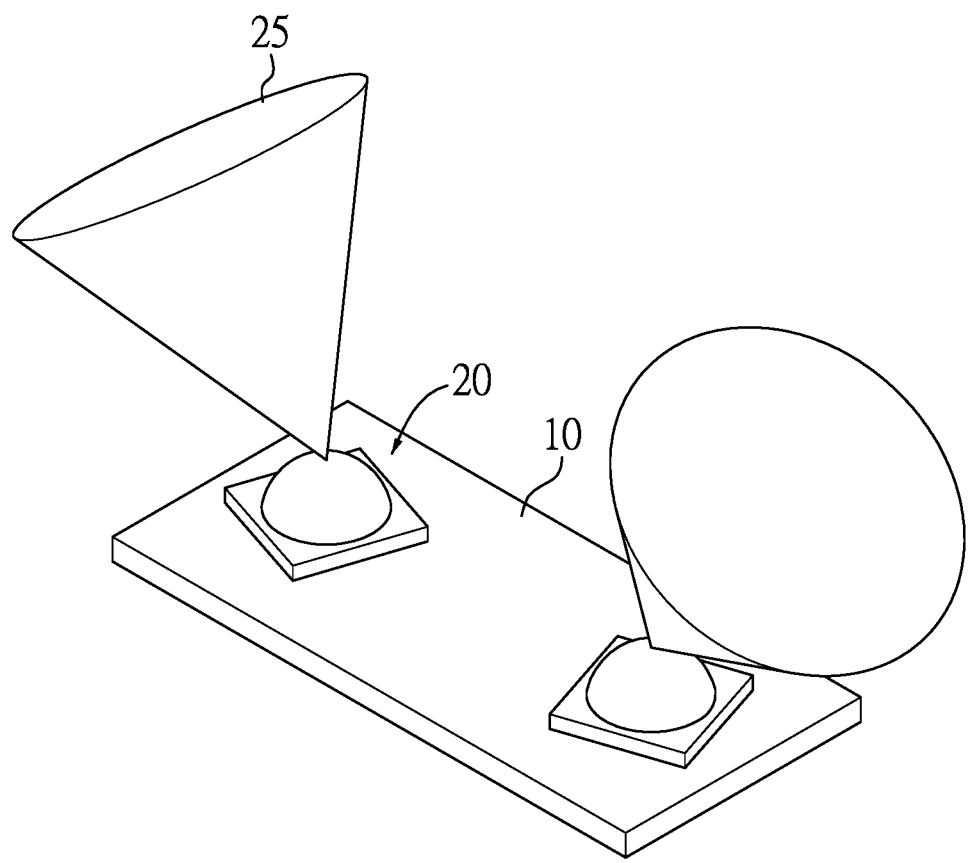
FIG. 6 is an operational schematic perspective view of another embodiment of a LED projection in accordance with the present invention.

In the present invention, with reference to FIG. 6, when each of the LED packages 20 on one substrate 10 is a surface-mount device (SMD) LED, the light beams are emitted in specific angles and form the desired light pattern 24A, 24A', 24B, 24B'. Manufacturer does not have to bend pins of LED or divide the substrate into multiple parts that are tilted relative to each other. Accordingly, the desired light pattern 24A, 24A', 24B, 24B' can be formed through simple manufacturing process and structure.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A light-emitting diode (LED) projection device for a camera comprising:
    a substrate; and
    at least one LED package mounted on the substrate, and each of the at least one LED package including
        a reflection surface;
        at least one LED chip disposed in the reflection surface; and
        a packaging lens encapsulating the at least one LED chip and attached to the reflection surface;
    wherein the camera has a lens assembly including a circuit board, and the circuit board is parallel with the substrate; and
    at least one light beam that is emitted from the at least one LED chip of the LED package and passes through the packaging lens is refracted by the packaging lens and forms a non-circular light pattern.

2. The LED projection device for the camera as claimed in claim 1, wherein the packaging lens of each of the at least one LED package is symmetrical in shape.

3. The LED projection device as claimed in claim 1, wherein each of the at least one LED chip of each of the at least one LED package is disposed away from a center of the reflection surface.

4. The LED projection device as claimed in claim 2, wherein each of the at least one LED chip of each of the at least one LED package is disposed away from a center of the reflection surface.

5. The LED projection device as claimed in claim 3, wherein each of the at least one LED package includes even number of LED chips, and each two of the LED chips are placed at opposite sides of the center of the reflection surface and are equidistant from the center of the reflection surface.

6. The LED projection device as claimed in claim 4, wherein each of the at least one LED package includes even number of LED chips, and each two of the LED chips are placed at opposite sides of the center of the reflection surface and are equidistant from the center of the reflection surface.

7. The LED projection device as claimed in claim 1, wherein the lens assembly is mounted on the substrate.

8. The LED projection device as claimed in claim 2, wherein the lens assembly is mounted on the substrate.

9. The LED projection device as claimed in claim 1, wherein the lens assembly further includes
    a lens being hollow and hemisphere and mounted on the circuit board of the lens assembly;
    a fastener securely connecting the lens and the substrate;
    a digital signal processing chip;
    an image sensor; and
    a filter;
    wherein the digital signal processing chip, the image sensor, and the filter are stacked on the circuit board in sequence and are covered by the lens.

10. The LED projection device as claimed in claim 3, wherein the lens assembly further includes
    a lens being hollow and hemisphere and mounted on the circuit board of the lens assembly;
    a fastener securely connecting the lens and the substrate;
    a digital signal processing chip;
    an image sensor; and
    a filter;
    wherein the digital signal processing chip, the image sensor, and the filter are stacked on the circuit board in sequence and are covered by the lens.

11. A method for controlling a light pattern projected by a LED projection device for a camera as claimed in claim 1, the method comprising steps of:
    step 1: determining a relation between a size of the LED chip and a first viewing angle ratio;
    wherein the first viewing angle ratio is designated as "Var1", and the size of the LED chip 21 is defined as a width of the LED chip 21 and is designated as "Cs", and the first viewing angle ratio is determined by
        (a) confirming a type of the packaging lens of the LED package;
        (b) choosing three different sizes of the LED chips (Cs);
        (c) encapsulating the three LED chips with the packaging lenses having the same curvature;

(d) determining the first viewing angle ratio (Var1) by a formula as follows:

$Var1=f(Cs);$ step 2: determining a relation between a displacement of the LED chip and a second viewing angle ratio;
wherein the second viewing ratio is designated as "Var2", and the displacement of the LED chip is define as a distance between the LED chip and a center position and is designated as "Ds", and the second viewing angle ratio is determined by
  (a) choosing the type of the packaging lens as used in step 1;
  (b) choosing three LED packages, wherein the size of the LED chips of the three LED packages are the same and the displacements of the three LED chips (Ds) are different;
  (c) encapsulating the three LED chips with the packaging lenses having the same curvature; and
  (d) defining the second viewing angle ratio (Var2) of the LED chip with displacement of 0 mm as 100%; and
  (e) determining the second viewing angle ratio (Var2) by a formula as follows:

$Var2=f(Ds);$ step 3: determining a relation between a height of the packaging lens and a third viewing angle ratio;
wherein the height of the packaging lens is defined as a distance between the LED chip and a top end of the packaging lens and is designated as "H", and the third viewing angle ratio of the LED package is designated as "Var3", and the third viewing angle ratio is determined by
  (a) choosing the type of the packaging lens as used in step 1;
  (b) choosing three LED packages, wherein the size of the LED chips of the LED packages are the same and the heights of the packaging lenses of the LED packages are different;
  (c) encapsulating the three LED chips with the packaging lenses having the same curvature;
  (d) defining the displacements of the three LED chips (Ds) as 0 mm; and
  (e) determining the third viewing angle ratio by a formula as follows:

$Var3=f(H);$ and step 4: determining a viewing angle (Va) of the LED package by a formula as follows:

$Va=f(H) \times f(Cs) \times f(Ds).$

12. A method for controlling a light pattern projected by a LED projection device for a camera as claimed in claim 1, the method comprising steps of:
  step A: calculating a radius of curvature of the packaging lens according to the height of the packaging lens and a radius of a circle surrounded by the packaging lens and defined on a reflection surface for mounting the LED chip;
  wherein the radius of curvature of the packaging lens is designated as "R", the radius of the circle surrounded by the packaging lens and defined on the reflection surface for mounting the LED chip is designated as "a", and the radius of curvature of the packaging lens is calculated by a formula as follows:

$R=(H2+a2)/(2H);$ and step B: calculating an angle of incidence θ1 of the light beam emitted from the LED chip on the packaging lens when the LED chip is disposed away from the center position, wherein the angle of incidence is calculated by a formula as follows:

$\theta 1 = arc\ sin(Ds/R);$ and step C: calculating the off-center angle θ2 of the light beam emitted out of the packaging lens by a formula as follows:

$\theta 2 = arc\ sin((n1/n2) \times sin\ \theta 1),$ wherein n1 is defined as a refractive index of the packaging lens and n2 is defined as a refractive index of air around the packaging lens.

* * * * *

UNITED STATES PATENT AND TRADEMARK OFFICE
CERTIFICATE OF CORRECTION

| | |
|---|---|
| PATENT NO. | : 10,694,089 B2 |
| APPLICATION NO. | : 16/199488 |
| DATED | : June 23, 2020 |
| INVENTOR(S) | : Yuan-Tai Huang |

It is certified that error appears in the above-identified patent and that said Letters Patent is hereby corrected as shown below:

On the Title Page

Item (73) should read:
(73) Assignees: Yuan-Tai Huang, Taipei (TW);
                Ming-Lun Ku, Taipei (TW);
                Sander Electronic Co., Ltd., Taipei (TW)

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*